United States Patent
Liu et al.

(10) Patent No.: US 8,673,687 B1
(45) Date of Patent: Mar. 18, 2014

(54) ETCHED HYBRID DIE PACKAGE

(75) Inventors: Chenglin Liu, San Jose, CA (US); Shiann-Ming Liou, Campbell, CA (US)

(73) Assignee: Marvell International Ltd. (BM)

(*) Notice: Subject to any disclaimer, the term of this patent is extended or adjusted under 35 U.S.C. 154(b) by 262 days.

(21) Appl. No.: 12/772,304

(22) Filed: May 3, 2010

Related U.S. Application Data

(60) Provisional application No. 61/176,075, filed on May 6, 2009.

(51) Int. Cl.
   *H01L 21/00* (2006.01)

(52) U.S. Cl.
   USPC ............. 438/112; 257/670; 257/E21.506; 257/E23.031

(58) Field of Classification Search
   USPC ......... 216/14; 257/E21.506, 670; 438/112, 438/111
   See application file for complete search history.

(56) References Cited

U.S. PATENT DOCUMENTS

| | | | |
|---|---|---|---|
| 5,454,929 A * | 10/1995 | Kinghorn | 205/128 |
| 6,818,973 B1 * | 11/2004 | Foster | 257/676 |
| 6,885,093 B2 | 4/2005 | Lo et al. | |
| 6,979,886 B2 | 12/2005 | Hung et al. | |
| 7,211,471 B1 | 5/2007 | Foster | |
| 7,507,603 B1 | 3/2009 | Berry et al. | |
| 7,556,987 B2 | 7/2009 | Dimaano, Jr. et al. | |
| 7,998,790 B2 * | 8/2011 | Camacho et al. | 438/111 |
| 2001/0008305 A1 | 7/2001 | McLellan et al. | |
| 2008/0233683 A1 | 9/2008 | Kwan et al. | |
| 2009/0072366 A1 * | 3/2009 | Badakere Govindaiah et al. | 257/676 |
| 2009/0142028 A1 * | 6/2009 | Martinez et al. | 385/137 |
| 2009/0223942 A1 * | 9/2009 | Heyl | 219/121.69 |
| 2009/0230523 A1 | 9/2009 | Chien et al. | |
| 2009/0230525 A1 | 9/2009 | Chang Chien et al. | |
| 2009/0230526 A1 | 9/2009 | Chen et al. | |
| 2009/0230529 A1 | 9/2009 | Dimaano, Jr. et al. | |
| 2010/0123227 A1 * | 5/2010 | Dahilig et al. | 257/675 |
| 2011/0057298 A1 * | 3/2011 | Ramos et al. | 257/667 |

OTHER PUBLICATIONS

Amkor Technology: "Application Notes for Surface Mount Assembly of Amkor's Dual Row MicroLeadFrame (MLF) Packages", Aug. 2005, Rev. A, pp. 1-16.

Amkor Technology: "Application Notes for Surface Mount Assembly of Amkor's MicroLeadFrame (MLF) Packages", Sep. 2008, Rev. G, pp. 1-19.

Amkor Technology: Data Sheet for "Leadframe CSP High Performance, Cost Efficient", Rev. Date Jun. 2009, 2 pgs.

Amkor Technology: Data Sheet for "Leadframe FusionQuad", Rev. Date Aug. 2008, 2 pgs.

Amkor Technology: Data Sheet for "Test Contractor FusionQuad", Rev. Date May 2009, 1 pg.

(Continued)

*Primary Examiner* — Caridad Everhart

(57) ABSTRACT

An embodiment includes a method that includes encapsulating a die and at least a portion of a lead-frame in a mold to form a package body. At least one primary lead attached to the lead-frame extends from the package body. The method includes etching a feature to within a threshold in an exposed die pad. The exposed die pad comprises a first surface that is prepared for etching and a second surface opposite to the first surface and attached to the die. The method includes positioning the die within a footprint of the exposed die pad, connecting the die to at least one primary lead, and connecting the feature to the die.

19 Claims, 7 Drawing Sheets

(56) References Cited

OTHER PUBLICATIONS

David Comley et al.: "The QFN: Smaller, Faster and Less Expensive", Chip Scale Review, Aug./Sep. 2002, pp. 51-57.

Amkor Technology: "Preliminary Surface Mount Application Notes for FusionQuad Package", Apr. 2008, 16 pgs.

Quad Flat Package from Wikipedia @ http://en.wikipedia.org/w/index.php?title=Quad_Flat_Package&printable . . . , Dec. 2009, 2 pgs.

Tim Olson et al: "Novel Leadframe-Based Package Provides Performance Boost for Hard Disk Drive Data Transfer Performance", Pan Pacific Microelectronics Symposium, Jan. 2008, Hawaii, 4 pgs.

* cited by examiner

ETCHED HYBRID DIE PACKAGE

CROSS REFERENCE TO RELATED APPLICATIONS

This disclosure claims the benefit of provisional application No. 61/176,075 filed May 6, 2009, which is wholly incorporated herein by reference.

BACKGROUND

Surface-mount technology (SMT) is a manner of constructing circuits with components that mount to the surface of a printed circuit board (PCB). Die packages are an example of a component used in SMT. A conventional die package includes a die connected to leads. The leads extend out from or are exposed within a die package body to provide for connecting the die package to the PCB. The die package body protects the die and is typically a plastic encapsulant material. Conventionally, a die package uses one type of lead. The leads may be lead-frame pins or a grid array leads. The number of pins in a die package is uniquely constrained when using only one type of lead arrangement.

Conventional lead-frame pins include leads extending from the perimeter of the die package. Dual in-line packages (DIP), ceramic DIPs (CDIP), plastic DIPs (PDIP), and thin small-outline packages (TSOP) are examples of packages with leads on only two edges of the perimeter. Quad flat packages (QFP), thin QFP (TQFP), low-profile QFP (LQFP), and plastic QFP (PQFP) are examples of packages with leads on all four edges of the perimeter. Using lead-frame pins in these configurations creates difficulties in achieving high pin counts. These difficulties arise from a fixed amount of space for pins and constraints on the size and spacing of the pins.

Grid array leads include pin grid array (PGA), a land grid array (LGA), or a ball grid array (BGA). Conventional grid array arrangements extend from or are exposed within a bottom surface of the die package. One challenge in grid array arrangements is the length of bond wires that connect leads to the die. Long bond wires induce difficulties with routing the bond wires back to the die. These routing difficulties result in manufacturing challenges.

Lead-frame arrangements may also include a metal exposed die pad on a bottom surface of the die package. Manufacturing leads into both the perimeter and the bottom surface of the die package is challenging. Conventional methods typically cut leads into the metal exposed die pad using a sawing isolation process. However, the sawing isolation process suffers from several manufacturing difficulties. The sawing isolation process uses a blade to isolate leads. Blade alignment difficulties arise with this method resulting in manufacturing waste. Other difficulties with the sawing isolation process include mold flash covering under body leads and residual copper dust remaining on the package after sawing. All of these difficulties increase the cost of manufacturing and are therefore undesirable.

The foregoing statements are not intended to constitute an admission that any patent, publication or other information referred to herein is prior art with respect to this disclosure. Rather, these statements serve to present a general discussion of technology and associated issues in the technology.

SUMMARY

An embodiment includes a method that includes encapsulating a die and at least a portion of a lead-frame in a mold to form a package body. At least one primary lead attached to the lead-frame extends from the package body. The method also includes etching a feature to within a threshold in an exposed die pad. The exposed die pad comprises a first surface that is prepared for etching, and a second surface opposite to the first surface and attached to the die. In the method, the die is positioned within a footprint of the exposed die pad, the die is connected to at least one primary lead, and the feature is connected to the die.

Another embodiment includes a device, comprising a die and a set of primary leads connected to the die. The die is encapsulated in a mold and the set of primary leads extend from the mold. The device also includes an exposed die pad attached to the die. A first surface of the exposed die pad is exposed for etching, the die is attached to a second surface of the exposed die pad that faces the mold and is opposite to the first surface of the exposed die pad, and the die is positioned within a footprint of the exposed die pad. The device includes a set of etched secondary leads connected to the die. The set of etched secondary leads (i) are located on the metal exposed die pad and (ii) extend from the second surface of the metal exposed die pad to the first surface of the metal exposed die pad. The set of etched secondary leads are electrically isolated from the exposed die pad.

Another embodiment includes a method that includes providing a lead-frame comprising an outer frame defining a central opening, a die pad disposed within the central opening with at least one feature attached to the die pad, and a plurality of primary leads attached to the outer frame and extending toward the die pad. The method includes attaching a semiconductor die to the die pad, electrically connecting the semiconductor die to at least one of the primary leads and the at least one feature, applying an encapsulant material to the lead-frame to form a package body, where portions of the primary leads protrude from the package body and portions of the at least one feature are exposed within the package body, and etching the die pad and the at least one feature to electrically isolate the at least one feature from the die pad.

BRIEF DESCRIPTION OF THE DRAWINGS

The accompanying drawings, which are incorporated in and constitute a part of the specification, illustrate various example systems, methods, and other example embodiments of various aspects of the invention. The illustrated element boundaries (e.g., boxes, groups of boxes, or other shapes) in the figures represent one example of the boundaries. In some examples one element can be designed as multiple elements or that multiple elements can be designed as one element. In some examples, an element shown as an internal component of another element can be implemented as an external component and vice versa. Furthermore, elements may not be drawn to scale.

DETAILED DESCRIPTION

Example methods and devices concern an etched hybrid die package. The etched hybrid die package provides a die package with a higher pin count than traditional lead-frame die packages while potentially avoiding manufacturing difficulties of conventional methods. Etching leads into an exposed die pad provides for obtaining higher pin counts. Obtaining higher lead counts while maintaining a larger lead pitch is possible by providing both etched inner leads and lead-frame pins. Etching the inner leads, instead of using a sawing isolation process, allows for higher precision resulting in flexible manufacturing options while avoiding difficulties with mold flash, saw misalignment, and copper dust. Example methods and devices avoid challenges with routing bond wires by extending a portion of the lead-frame pins into the mold. This avoids difficulties with routing by shortening the length of the bond wires.

The following includes definitions of selected terms employed herein. The definitions include various examples and/or forms of components that fall within the scope of a term and that may be used for implementation. The examples are not intended to be limiting. Both singular and plural forms of terms may be used within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

Figure 1:
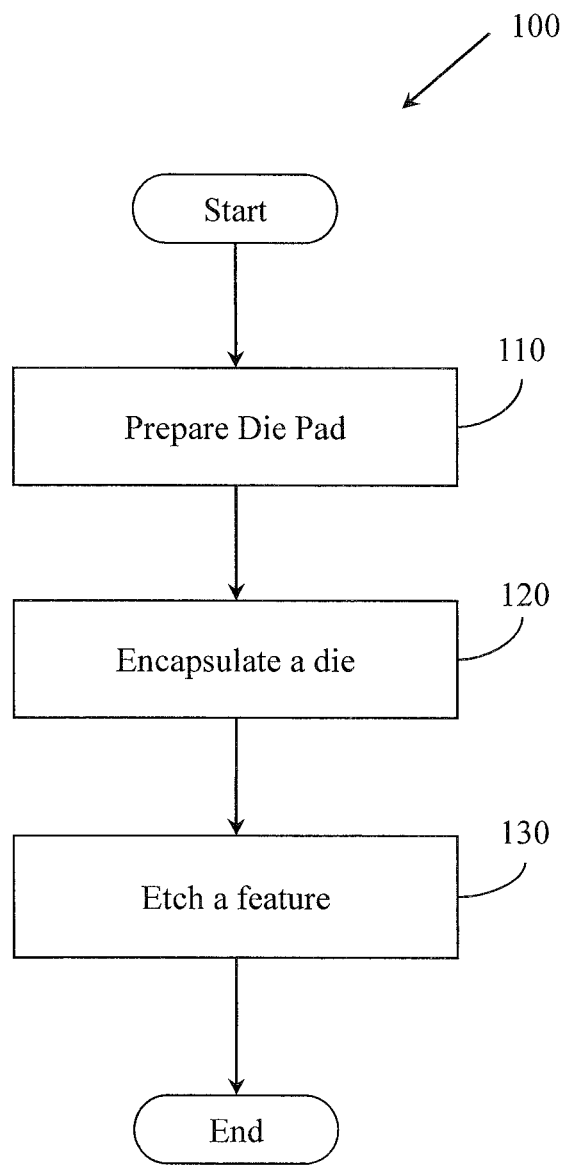
FIG. 1 illustrates a flow chart that describes a method associated with controlling a fabricator to etch a feature in a die package.

FIG. 1 illustrates a method 100 for use in fabricating a die package. The die package includes an exposed die pad. The exposed die pad is, for example, a generally flat square shape. The exposed die pad includes a planar bottom or first surface and an opposing top or second surface that, prior to preparation for etching, is also generally planar.

At 110, a fabricator prepares the second surface of the exposed die pad for etching. In one embodiment, preparing the second surface for etching includes removing a portion of the exposed die pad by half-etching the second surface of the exposed die pad. Half-etching the die pad may include, for example, removing an amount of the exposed die pad substantially equal to one-half of the thickness of the exposed die pad in selected regions. Preparing the second surface includes removing regions to define an upper region of a feature that will be disposed within an encapsulant material. Preparing the die pad may also include removing portions of the second surface to define an area to attach a die. After preparing the second surface a die may be attached to the second surface of the exposed die pad. Once the die is in place bonding wires are used to connect the die to the feature and the primary leads. The die is positioned within a footprint of the exposed die pad. Positioning the die in this manner facilitates heat dissipation from the die.

Preparing the first surface of the die pad for etching may occur before, after, or simultaneously with preparing the second surface. Preparing the first surface of the exposed die pad includes applying a coating to selected regions of the first surface of the exposed die pad. The regions on the first surface correlate to portions of the exposed die pad where etching will not remove material.

At 120, the fabricator encapsulates the die and at least a portion of a lead-frame in a mold. The mold may be a plastic, a resin, a ceramic, or a similar material known to one of ordinary skill in the art for use as an encapsulant material. The mold forms a package body with at least one primary lead attached to the lead-frame and extending from the perimeter of the package body. The die package may include a plurality of primary leads extending from the package body. Encapsulating envelops the second surface of the exposed die pad in mold while leaving the first surface exposed in the underside of the package body. The die package may be a quad-flat package (QFP) with an exposed die pad. The QFP includes a plurality of primary leads extending from each of the four sides of the perimeter.

The encapsulant material also encapsulates the upper region of the feature prepared at 110. Encapsulating the die in a mold occurs prior to separating the feature from the exposed die pad. Encapsulating the die prior to etching the feature avoids challenges with mold flash that occurs in conventional processes.

At 130, the fabricator etches the feature in the first surface of the exposed die pad. Etching the feature includes etching the feature to within a threshold. The threshold may be an amount substantially equal to one-half of the thickness of the exposed die pad. Removing the threshold amount of material electrically isolates the feature from the exposed die pad. After etching the feature, a void separates the feature from the exposed die pad.

Prior to etching the feature, the exposed die pad substantially covers an entire bottom surface of the package body. Etching the exposed die pad to form the feature reduces the size of the exposed die pad to form a reduced exposed die pad. The reduced exposed die pad may cover an area equal to at least a footprint of the die.

The feature may be a ring that circles the reduced exposed die pad. The ring may be a power ring or a ground ring. The feature may also be a combination of a bar, secondary leads, or a ring. In one embodiment, the feature is a dual row set of secondary leads. The dual row set of leads includes two rows of leads at each side of the reduced exposed die pad.

Etching the exposed die pad to form the feature does not contaminate the package body, the at least one primary lead, and the feature with copper dust. Leaving the die package substantially free of copper dust facilitates preventing electrical shorts between leads.

A process may control the fabricator to implement method 100. Additionally, Application Specific Integrated Circuits (ASICs) may control the fabricator to perform method 100. The fabricator may be a device known to one of ordinary skill in the art for fabricating die packages and their components. The fabricator is controlled by, but is not limited to, hardware, firmware, instructions executing on a machine, and/or combinations thereof.

Figure 2:
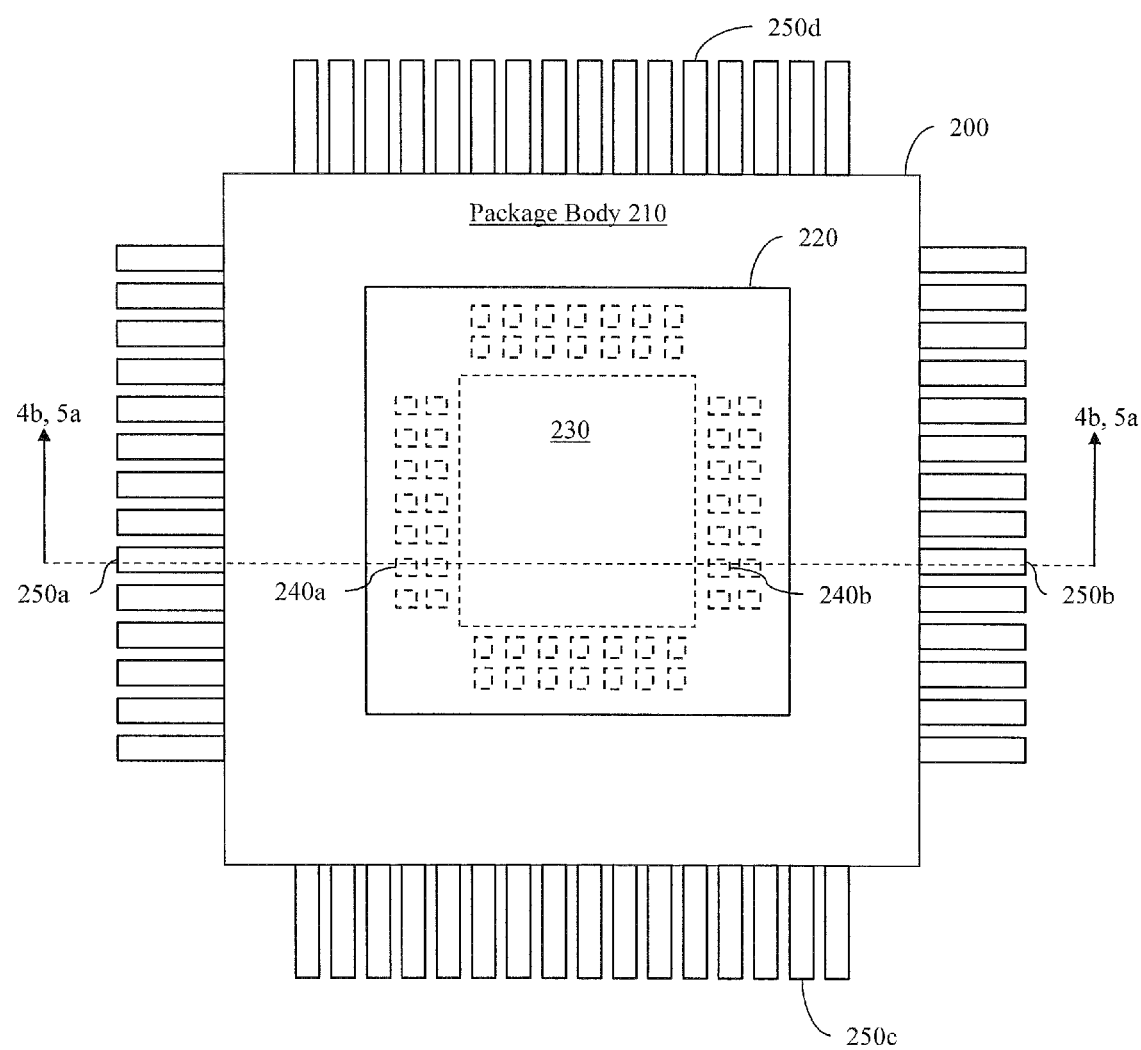
FIG. 2 illustrates an underside view of a die package with an exposed die pad prior to etching the exposed die pad.

FIG. 2 illustrates an underside view of a die package 200 with an exposed die pad 220 prior to etching the exposed die pad 220. Die package 200 includes primary leads 250a, 250b, 250c and 250d. The primary leads connect to a die within die package body 210 with bonding wires. Primary leads 250a, 250b, 250c and 250d extend into the package body 210 and are part of a lead-frame. Package body 210 may form a generally square shape. Package body 210 may be plastic, resin, or ceramic. A first surface of exposed die pad 220 is exposed within the bottom surface of die package 200. Dashed lines illustrate areas of exposed die pad 220 that are prepared for etching. A mask covers the area where reduced exposed die pad 230 will be after surrounding material in the exposed die pad 220 is etched. A mask also covers secondary leads 240a and 240b.

Figure 3:
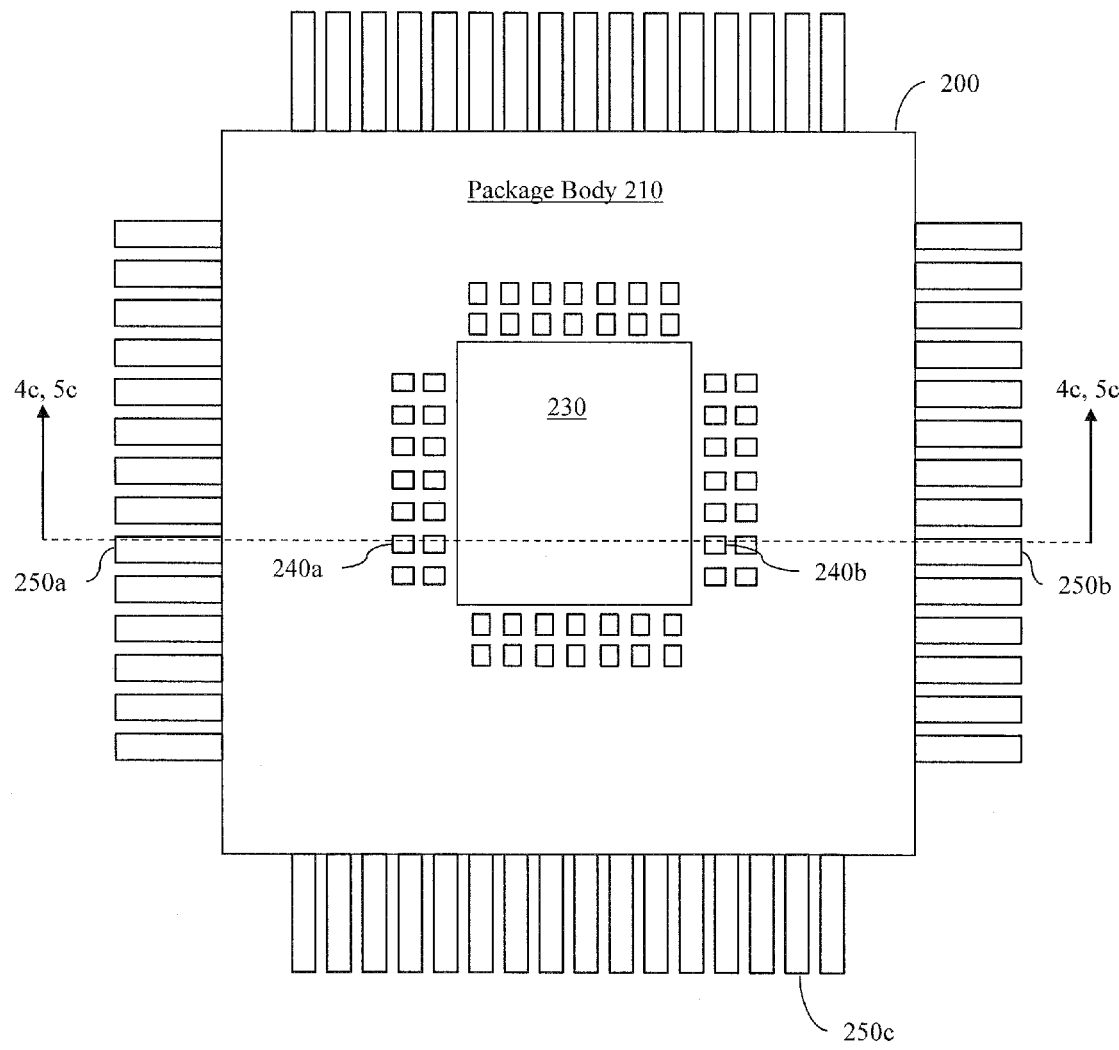
FIG. 3 illustrates an underside view of a die package with an exposed die pad and etched secondary leads.

FIG. 3 illustrates an underside view of a die package 200 with a reduced exposed die pad 230 and etched secondary leads 240a and 240b. The etching process removes material from the exposed die pad to electrically isolate the reduced exposed die pad 230 from the surrounding etched secondary leads including secondary leads 240a and 240b. Die package 200 includes primary leads 250a, 250b, 250c and 250d. Primary leads 250a, 250b, 250c and 250d extend into the package body 210 and are part of a lead-frame that is disposed within the package body. The primary leads connect to a die within package body 210 with bonding wires. Package body 210 may form a generally square shape. Package body 210 may be plastic, resin, or ceramic.

In one embodiment, connecting members link primary leads. The connecting members may abut package body 210 and facilitate preventing molding compound from flowing between primary leads. For example, primary lead 250a is initially connected to adjacent primary leads by connecting members. An etching resistant material may cover the primary leads while the connecting members are left exposed. The etching process electrically isolates the primary leads from each other by removing the connecting members.

Figure 4A:
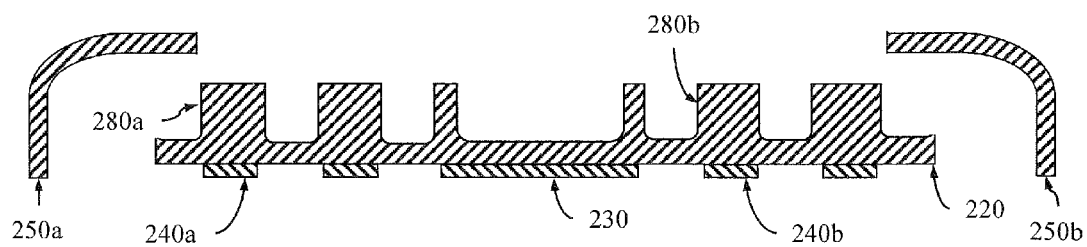
FIG. 4a illustrates a cross-section of a lead-frame with an exposed die pad prior to encapsulating.

FIG. 4a illustrates a cross-section of a lead-frame including primary leads 250a and 250b, and an exposed die pad 220 prior to encapsulating. Preparing die pad 220 exposes an upper region 280a of a secondary lead 240a by half-etching from the second surface. Other characteristics of die pad 220 are apparent in FIG. 4a. An upper region 280b of a secondary lead 240b is half-etched. Upper regions of other secondary leads are also half-etched. A die may be attached to the prepared upper surface of reduced exposed die pad 230. Preparing the first surface of exposed die pad 220 for etching includes selectively applying a coating to regions of the first surface that will define at least one feature. For example, the coating may cover a portion of the exposed die pad 220 that will form secondary lead 240b.

Figure 4B:
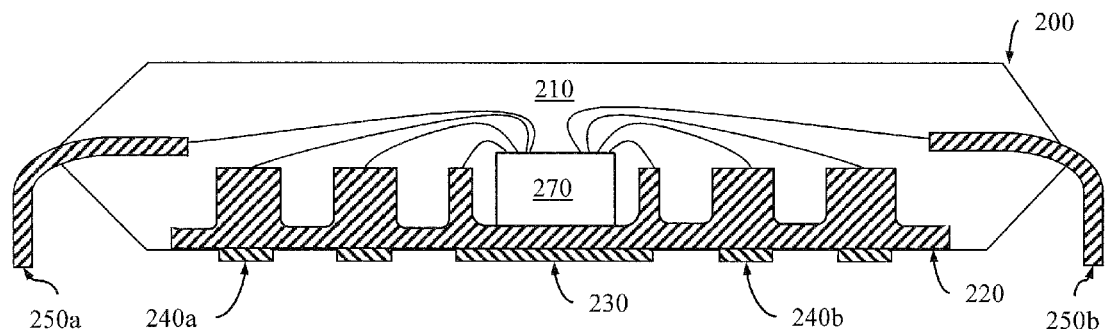
FIG. 4b illustrates a cross-section of a device including a lead-frame and an exposed die pad prior to etching secondary leads into the exposed die pad.

FIG. 4b illustrates a cross-section of a device 200 including a lead-frame with primary leads 250a and 250b and an exposed die pad 220 prior to etching secondary leads 240a and 240b into the exposed die pad 220. FIG. 4b also illustrates the die package 200 after attachment of the die 270 and forming of a package body 210. The package body 210 may be a plastic encapsulant material that encloses die 270, the second surface of exposed die pad 220, and portions of primary leads 250a and 250b that form part of the lead-frame.

Figure 4C:
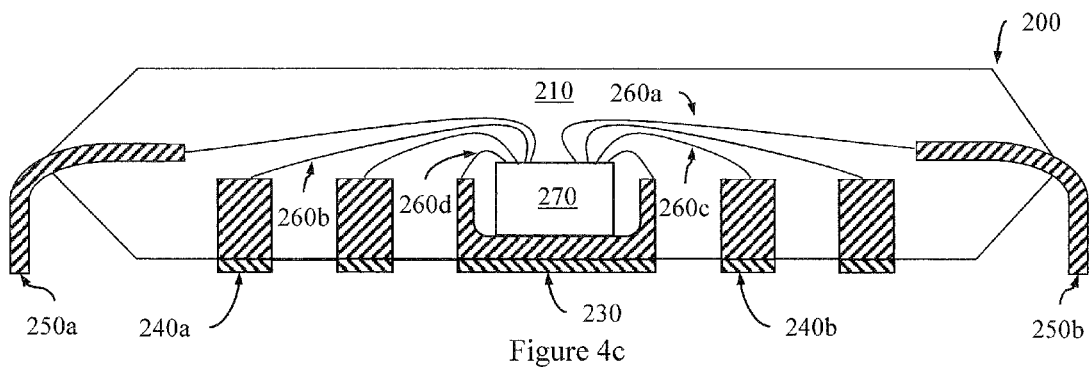
FIG. 4c illustrates a cross-section of a device including a lead-frame and an exposed die pad after etching secondary leads into the exposed die pad.

FIG. 4c illustrates a cross-section of the device 200 with a lead-frame and a reduced exposed die pad 230 after etching secondary leads 240a and 240b into the exposed die pad 220. Etching the first surface of exposed die pad 220 to within a threshold electrically isolates reduced exposed die pad 230 from secondary leads 240a and 240b. Etching to within a threshold electrically isolates secondary leads by half-etching the first surface of exposed die pad 220. Half-etching removes an amount of material from the exposed die pad 220 substantially equal to one-half the thickness of the exposed die pad 220. This removes material correlating to the half-etching of the second surface and completes the feature, in this case secondary leads 240a and 240b. Etched secondary leads 240a and 240b are electrically isolated from reduced exposed die pad 230 by the half-etching. Etched secondary lead 240a is an outer row etched secondary lead. Etched secondary lead 240b is an inner row etched secondary lead. Etched secondary leads 240a and 240b are part of a dual row set of etched secondary leads.

Attaching the die 270 to primary leads 250a and 250b and a feature occurs prior to applying the encapsulant material. Bonding wire 260a connects primary lead 250b to the die 270. Primary lead 250a connects to the die 270 in the same way. Bonding wire 260b connects etched secondary lead 240a to the die 270. Bonding wire 260c connects etched secondary lead 240b to the die 270. Bonding wire 260d connects the die 270 to the reduced exposed die pad 230. Reduced exposed die pad 230 may be a ground connection. Bonding wires similar to those illustrated connect the die 270 to each primary lead and the feature.

FIGS. 4a, 4b, 4c illustrate an embodiment where a dual row set of secondary leads is etched into the exposed die pad. However, various embodiments include etching different features into the exposed die pad including a single row set of secondary leads, bars, rings and combinations of these features.

Figure 5A:
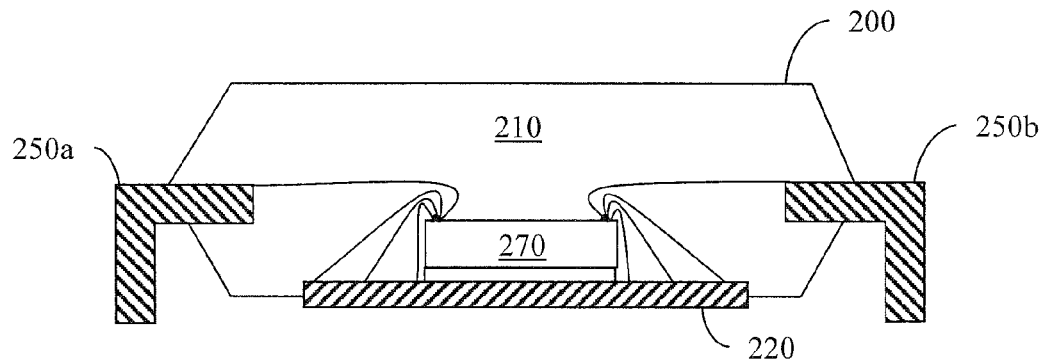
FIG. 5a illustrates a cross-section of a device including a lead-frame and an exposed die pad prior to etching secondary leads into the exposed die pad.

FIG. 5a illustrates a cross-section of a device 200 including a lead-frame with primary leads 250a and 250b and an exposed die pad 220 prior to etching secondary leads into the exposed die pad 220. Package body 210 is an encapsulant material. The encapsulant material may be plastic, ceramic, resin or a similar compound.

Figure 5B:
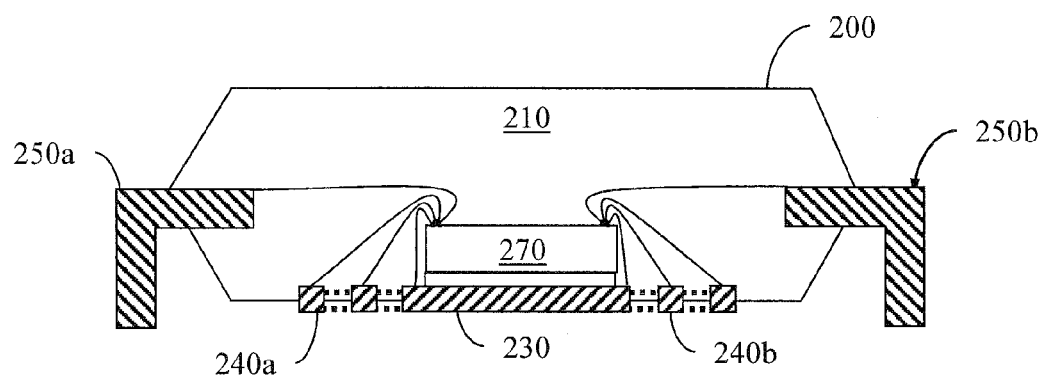
FIG. 5b illustrates a cross-section of a device with an exposed die pad and where material in the exposed die pad is removed to form the secondary leads.

FIG. 5b illustrates a cross-section of the device 200 with a reduced exposed die pad 230 and electrically isolated etched secondary leads 240a and 240b. The dashed lines in FIG. 5b illustrates where etching removes material in the exposed die pad to form the secondary leads 240a and 240b and the reduced exposed die pad 230.

Figure 5C:
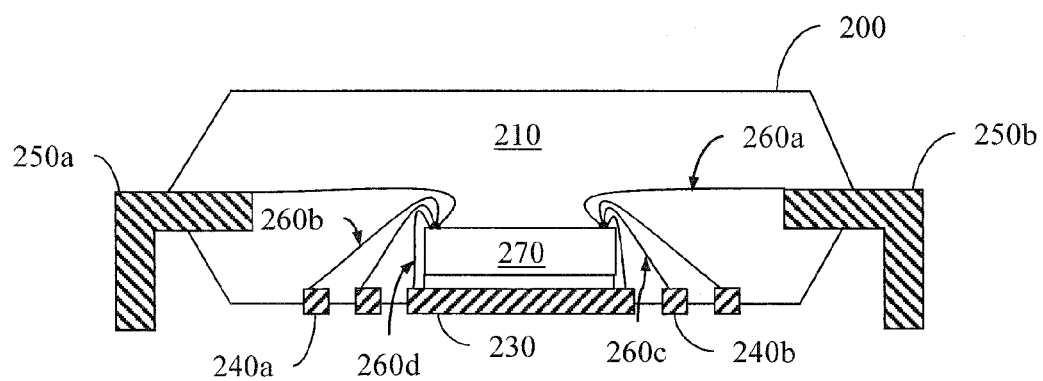
FIG. 5c illustrates a cross-section of a device including a lead-frame and an exposed die pad after etching secondary leads into the exposed die pad.

FIG. 5c illustrates a cross-section of the device 200 including a lead-frame with primary leads 250a and 250b and a reduced exposed die pad 230 after etching secondary leads 240a and 240b into the exposed die pad 220. Device 200 also includes a die 270. Die 270 is a semiconductor die. Die 270 may be attached to reduced exposed die pad 230 with a bonding material that electrically insulates the die 270 from the reduced exposed die pad 230. The bonding material also facilitates heat dissipation from the die 270.

FIG. 5c also illustrates that device 200 may include a set of primary leads. Primary leads 250a and 250b are members of the set of primary leads. Primary lead 250b is connected to the die 270 by bonding wire 260a. The set of primary leads may be gull-wing leads that extend from the perimeter of the package body 210. Device 200 includes bonding wires to connect the die 270 to leads and features. Bonding wires 260a, 260b, 260c, and 260d are examples of bonding wires. Bonding wire 260b connects outer row etched secondary lead 240a to the die 270. Bonding wire 260c connects inner row etched secondary lead 260c the die 270. Bonding wire 260d connects the reduced exposed die pad 230 to the die 270.

The die 270 is encapsulated in a mold with the primary leads 250a and 250b extending from the mold. The mold and a lead-frame form a package body 210. The lead-frame may be a pre-plated lead-frame (PPF). The set of primary leads are a part of the lead-frame extending from the package body 210. The lead-frame connects the set of primary leads to the bonding wires. The set of primary leads are part of the lead-frame that is at least partially enclosed within the mold.

Device 200 includes an exposed die pad 230 attached to the die 270. The die 270 is attached to a second surface of the exposed die pad 220 that faces the mold. The second surface of the exposed die pad 220 is opposite to the first surface of the exposed die pad 220. The die 270 sits within a footprint of the exposed die pad 220. The first surface of the exposed die pad 220 is exposed for etching.

The device 200 includes a set of etched secondary leads connected to the die 270. Etched secondary leads 240a and 240b are members in the set of etched secondary leads. The set of etched secondary leads are located on the metal exposed die pad 220 and extend from the second surface of the metal exposed die pad 220 to the first surface of the metal exposed die pad 220. The set of etched secondary leads are electrically isolated from the reduced exposed die pad 230.

A lead pitch of the set of secondary leads may be less than 0.4 mm. The lead pitch is the distance between the centerlines of two adjacent leads. The device 200 may be a Quad-Flat Package (QFP) or a Dual-Inline Package. The QFP may be a Thin QFP (TQFP) or a Low-profile QFP (LQFP).

Figure 6:
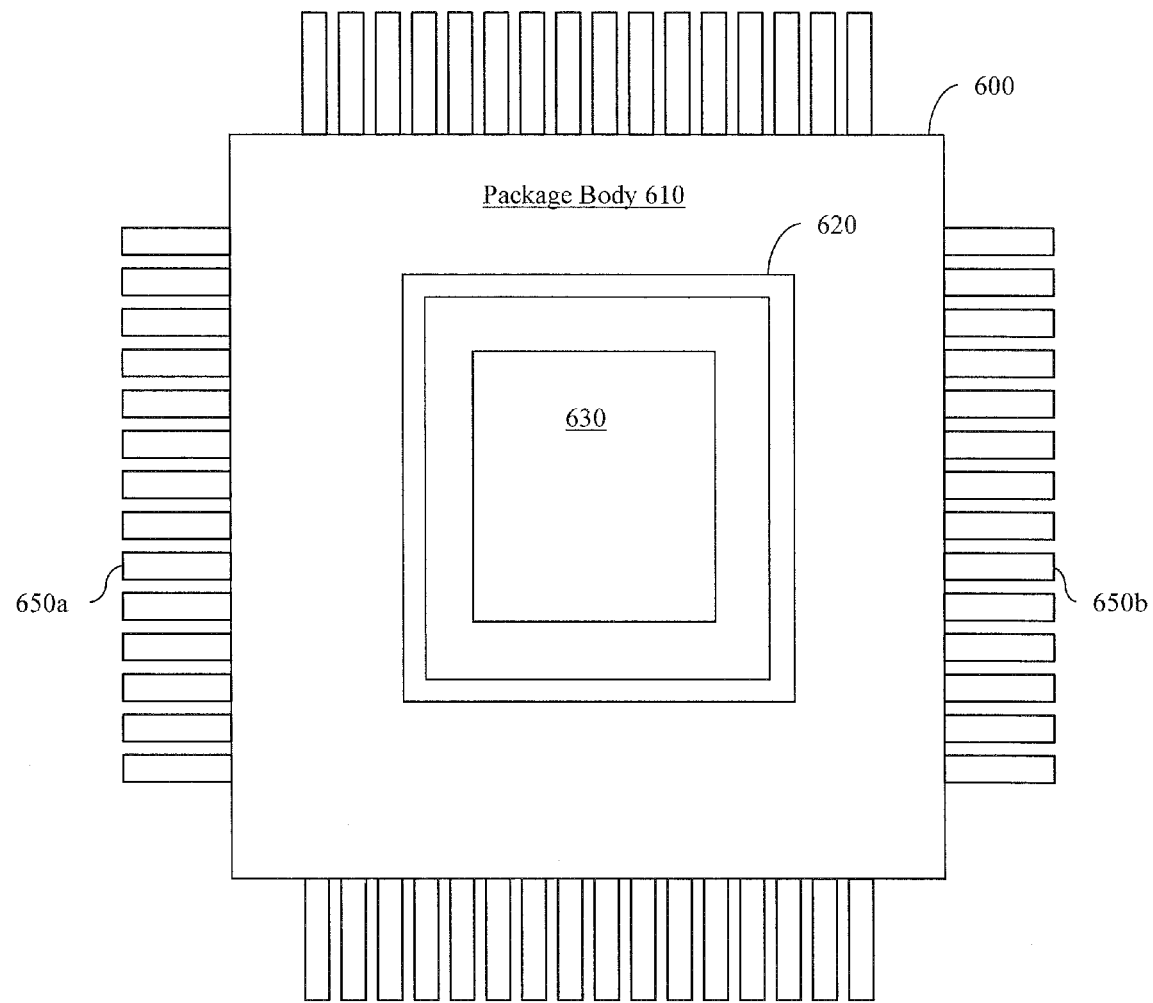
FIG. 6 illustrates an underside view of a die package with an exposed die pad and an etched ring/island.

FIG. 6 illustrates an underside view of a die package 600 with a reduced exposed die pad 630 and an etched ring/island 620. Die package 600 includes a die package body 610 and primary leads 650a and 650b. Die package 600 is an example of a QFP with an etched exposed die pad where the etched feature is a ring/island 620.

Figure 7:
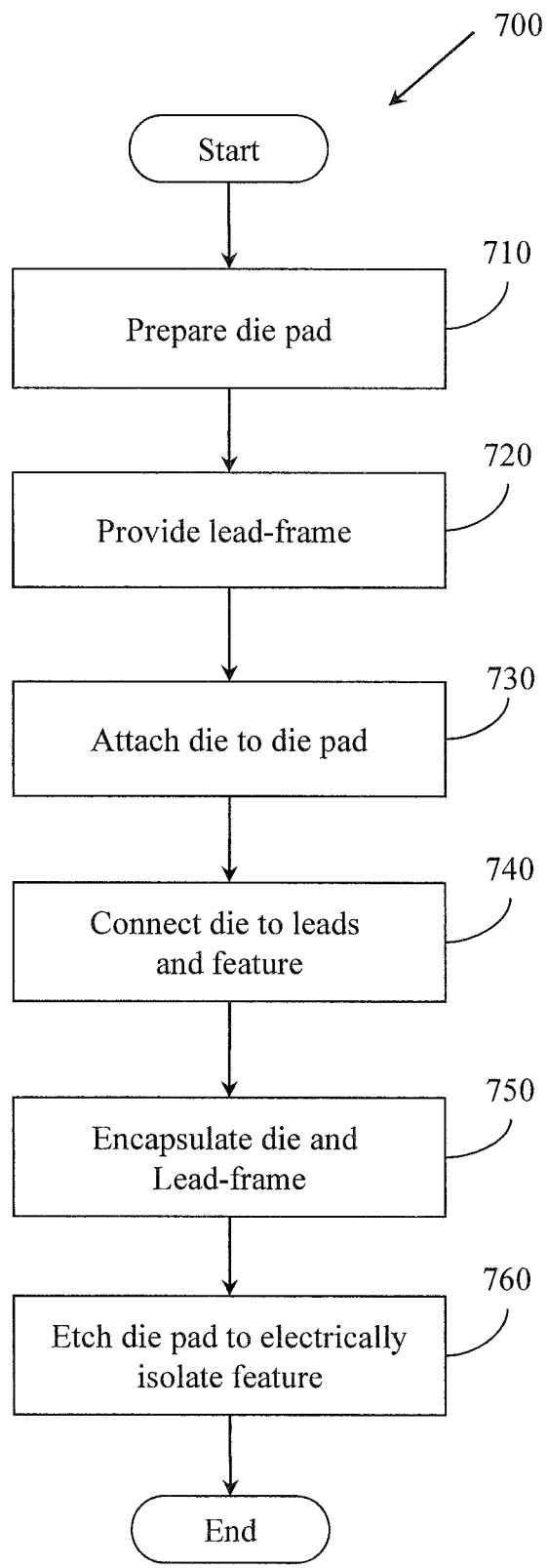
FIG. 7 illustrates a flow chart that describes a method associated with fabricating a die package with an etched feature.

FIG. 7 illustrates a flow chart that describes a method 700 associated with fabricating a die package with an etched feature. At 710, fabrication begins by preparing the die pad for etching. Preparing the die pad for etching may include preparing a second surface of the die pad to form an upper region of at least one feature. The upper region of the feature is to be disposed within the die package body and connects the feature to the die via a bonding wire. Forming an upper region of a feature may include removing material from the second surface of the exposed die pad by etching. The upper region of the feature to be disposed within the package body is generally a portion of the feature sufficient to secure the feature against movement. In one embodiment, the upper region of the feature is substantially equal to half of the height of the feature. In other embodiments, the upper region may be less than half of the height of the feature or more than half of the height of the feature.

Preparing the die pad for etching 710 may also include preparing the first surface of the die pad that is exposed on the underside of the die package. Preparing the first surface may include selectively applying a coating to the first surface. The coating is applied in regions where it is desirable to prevent removal of material from the die pad. Preventing removal of material in selective regions provides for defining lower portions of the feature upon etching. Preparing the first surface may occur at anytime prior to step 760.

At 720, the die package continues fabrication by providing a lead-frame. The lead-frame may include an outer frame defining a central opening with the die pad disposed within the central opening. There may be at least one feature attached to the die pad. The lead-frame also includes a plurality of primary leads attached to the outer frame and extending toward the die pad. The primary leads may be gull-wing type leads.

At 730, a semiconductor die is attached to the die pad. A bonding material may adhere the semiconductor die to the die pad and may also electrically insulate the semiconductor die from the die pad. The position of the semiconductor is generally central on the die pad.

At 740, the primary leads and the feature are connected to the semiconductor die. Bonding wires complete the electrical connection between the semiconductor die and the primary leads and the feature.

At 750, an encapsulant material is applied to the lead-frame to form a package body. Portions of the primary leads protrude from the package body. Portions of the at least one feature are exposed within the package body. Applying the encapsulant material while the at least one feature is attached to the die pad prevents mold flash from forming over the die pad and the at least one feature.

At 760, fabrication of the die package continues by etching the die pad and the at least one feature to electrically isolate the at least one feature from the die pad. Etching the die pad and the at least one feature forms a lower region of a reduced die pad and a lower region of the at least one feature by removing material from the die pad.

The at least one feature may be a plurality of secondary leads, a bar, a power ring, or a ground ring. Using an etching process to form features in the die pad achieves versatility in the manufacturing of a die package that is challenging when using a sawing isolation process. The sawing isolation process leaves saw streets in the package body. These saw streets are detrimental to forming certain features and combinations of features in the die pad. Thus, a die package manufactured using etching to form features in the die pad is advantageous over prior art methods.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B), the term "or" is intended to mean "A or B or both". The phrase "only A or B but not both" indicates that "only A or B but not both" is to be employed. Thus, use of the term "or" herein is the inclusive, and not the exclusive use. See, Bryan A. Garner, A Dictionary of Modern Legal Usage 624 (2d. Ed. 1995).

What is claimed is:

1. A method, comprising:
encapsulating a die and at least a portion of a lead-frame in a mold to form a package body, wherein at least one primary lead attached to the lead-frame extends from the package body; and
chemically etching a feature to within a threshold in an exposed die pad, wherein the exposed die pad comprises:
a first surface that is prepared for etching, and
a second surface opposite to the first surface and attached to the die, wherein the die is positioned within a footprint of the exposed die pad, wherein the die is connected to at least one primary lead, and wherein the feature is connected to the die, and wherein chemically etching the feature includes etching the feature without producing a saw street in the exposed die pad.

2. The method of claim 1, wherein the feature is at least one secondary lead.

3. The method of claim 1, wherein the threshold denotes an amount of material to be removed during etching to electrically isolate the feature from the exposed die pad.

4. The method of claim 1, wherein the feature is a ring, and wherein the ring is a power ring or a ground ring.

5. The method of claim 1, wherein the feature is a dual row set of secondary leads that encircles the exposed die pad.

6. The method of claim 1, wherein the package body, the at least one primary lead, and the feature are substantially free of copper dust.

7. The method of claim 1, wherein etching the feature reduces the size of the exposed die pad to form a reduced exposed die pad, wherein the exposed die pad substantially covers an entire bottom surface of the package body, and wherein the reduced exposed die pad covers an area equal to at least an area of the die on the bottom surface of the package body.

8. The method of claim 1, further comprising:
preparing the second surface of the exposed die pad for etching prior to encapsulating.

9. A device, comprising:
a die;
a set of primary leads connected to the die, wherein the die is encapsulated in a mold and the set of primary leads extend from the mold;
an exposed die pad attached to the die, wherein a first surface of the exposed die pad is exposed for etching, wherein the die is attached to a second surface of the exposed die pad that faces the mold and is opposite to the first surface of the exposed die pad, and wherein the die is positioned within a footprint of the exposed die pad; and
a set of etched secondary leads connected to the die, the set of etched secondary leads (i) being etched from the exposed die pad and (ii) extending from the second surface of the exposed die pad to the first surface of the exposed die pad, wherein the set of etched secondary leads are electrically isolated from the exposed die pad by chemically etching the exposed die pad, and wherein the set of etched secondary leads are a dual row set of secondary leads that encircle the exposed die pad.

10. The device of claim 9, further comprising:
a pre-plated lead-frame (PPF) encapsulated in the mold and forming a package body, wherein the PPF connects the set of primary leads to the die.

11. The device of claim 10, wherein the set of primary leads are gull-wing leads extending from the perimeter of the package body.

12. The device of claim 9, wherein the device is one of a Quad-Flat Package (QFP) or a Dual-Inline Package, and wherein the QFP is one of a Thin QFP (TQFP) or a Low-profile QFP (LQFP).

13. The device of claim 9, wherein a lead pitch of the set of secondary leads is less than 0.4 mm.

14. The device of claim 9, wherein the set of primary leads are part of a leadframe that is at least partially enclosed within the mold and wherein etching includes etching the exposed die pad without producing a saw street in the exposed die pad.

15. A method, comprising:
providing a lead-frame, the lead-frame comprising
an outer frame defining a central opening,
a die pad disposed within the central opening with at least one feature attached to the die pad, and
a plurality of primary leads attached to the outer frame and extending toward the die pad;
attaching a semiconductor die to the die pad;
electrically connecting the semiconductor die to at least one of the primary leads and the at least one feature;
applying an encapsulant material to the lead-frame to form a package body, wherein portions of the primary leads protrude from the package body and portions of the at least one feature are exposed within the package body; and
chemically etching the die pad to form and electrically isolate the at least one feature from the die pad, wherein chemically etching includes etching the die pad without producing a saw street or cut line in the package body.

16. The method of claim 15, wherein the at least one feature is a dual row set of secondary leads that encircle the die pad.

17. The method of claim 15, further comprising:
preparing the die pad for etching prior to providing the lead-frame.

18. The method of claim 17, wherein preparing the die pad for etching comprises:
forming an upper region of the at least one feature to be disposed within the package body by removing at least a portion of the die pad.

19. The method of claim 18, wherein preparing the die pad for etching comprises:
forming an upper region of a reduced die pad to be disposed within the package body by removing at least a portion of the die pad, wherein etching the die pad and the at least one feature to electrically isolate the at least one feature forms a lower region of the reduced die pad and a lower region of the at least one feature.

\* \* \* \* \*